United States Patent [19]
Salt

[11] 4,154,096
[45] May 15, 1979

[54] CIRCUIT FOR PRODUCING A DIGITAL COUNT REPRESENTING THE AVERAGE VALUE OF A VARIABLE FREQUENCY

[75] Inventor: James M. Salt, Walsall, England

[73] Assignee: Lucas Industries Limited, Birmingham, England

[21] Appl. No.: 881,523

[22] Filed: Feb. 27, 1978

[30] Foreign Application Priority Data
Mar. 2, 1977 [GB] United Kingdom ............... 8867/77

[51] Int. Cl.² ........................................ G01M 15/00
[52] U.S. Cl. ............................... 73/115; 235/92 CC; 364/431
[58] Field of Search .............. 73/115, 117.3; 364/431, 364/484, 575; 328/41; 235/92 CC

[56] References Cited
U.S. PATENT DOCUMENTS

| 3,767,902 | 10/1973 | Estes et al. | 235/92 CC X |
| 4,073,432 | 2/1978 | Schroder | 235/92 CC X |

*Primary Examiner*—Jerry W. Myracle
*Attorney, Agent, or Firm*—Andrus, Sceales, Starke & Sawall

[57] ABSTRACT

To obtain a digital signal representative of the average value of the frequency of a V.C.O. 11, a monostable is used to produce fixed length pulses at an indeterminate frequency. These pulses are counted by a control counter and enable a gate to pass the V.C.O. output to a counter connected as a frequency divider. Both of these counters are preset with the same count state and the "borrow" outputs from the dividing counter are counted in a signal counter, the number of "borrow" pulses received in the time taken for the control counter to count to its preset state being the required digital signal.

7 Claims, 1 Drawing Figure

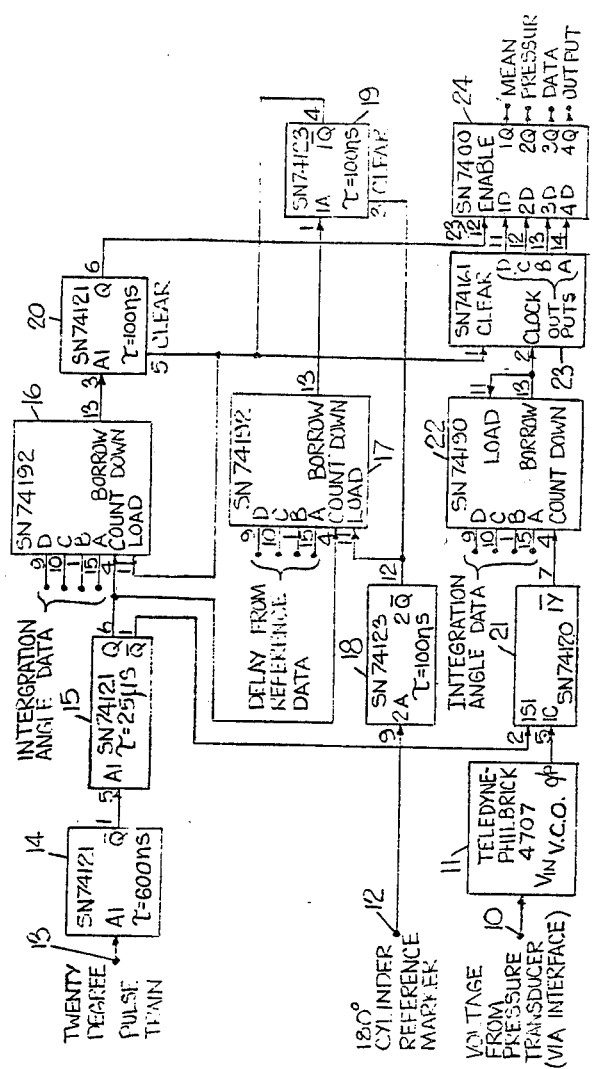

CIRCUIT FOR PRODUCING A DIGITAL COUNT REPRESENTING THE AVERAGE VALUE OF A VARIABLE FREQUENCY

This invention relates to a circuit for producing a digital count representing the average value of the frequency of a variable frequency signal pulse train.

A circuit in accordance with the invention comprises means for generating fixed duration pulses, a control counter for counting a predetermined number of said fixed duration pulses, gate means for passing said variable frequency signal only during said fixed duration pulses, frequency dividing means producing one output pulse each time said gate means passes said predetermined number of signal pulses and signal counter means counting the number of said output pulses produced during the time taken for said control counter to count said predetermined number of said fixed duration pulses.

Where, as is intended, the circuit is used in an engine control system, the fixed duration pulses may be produced by the combination of an engine shaft position transducer and one or more monostable circuits.

The variable frequency signal pulse train may be generated by means of a voltage controlled oscillator so that the digital count produced represents the average value of the voltage controlling such oscillator.

An example of the invention is shown diagrammatically in the accompanying drawing.

The circuit shown is intended to produce a digital count representing the average value of an air pressure during a predetermined angle of revolution of the engine shaft. The air pressure is measured using a suitable pressure transducer providing a variable output voltage which is applied to an input terminal 10 of the circuit. This input terminal 10 is connected to the control voltage terminal of a voltage controlled oscillator 11, preferably constituted by a commercially available module type 4707 manufactured by Teledyne Philbrick.

The overall system also includes an engine shaft position transducer (not shown) which produces at a terminal 12 a pulse every 180° of shaft revolution and at a terminal 13 a pulse every 20° of shaft revolution. These 20° pulses are applied to a monostable circuit 14 constituted by an SN 74121 integrated circuit with external components (not shown) to provide a negative going pulse of duration 600 nS. The 20° pulses are applied to the A1 input terminal of this monostable circuit and the output terminal is taken from the corresponding $\overline{Q}$ output terminal. The trailing edge of the negative going output pulse of the monostable circuit 14 is used to trigger another monostable circuit 15 again constituted by an SN 74121 integrated circuit, this one having external components to provide a reversion time of 25 μS. The B input terminal is used and a positive going 25 μS pulse appears at the Q output terminal and a negative going 25 μS pulse at the $\overline{Q}$ output terminal.

The Q output of the monostable circuit 15 is connected to the COUNT DOWN input terminal of a pre-settable counter 16 (type SN 74192) and also to the COUNT DOWN input terminal of a further pre-settable counter 17 (also type SN 74192). The LOAD terminal of this counter 17 is connected to the 2$\overline{Q}$ output terminal of a monostable circuit 18 type SN 74123 with external components (not shown) arranged to give a reversion time of 100 nS. The 2A input of the circuit 18 is connected to the terminal 12. The data input terminals of the counter 17 are connected to a matrix determining the count to which the counter 17 is set when the signal at the LOAD terminal goes low, which determines the number of degrees through which the engine shaft must turn after the 180° pulse before the average generating operation commences.

The BORROW output terminal of the counter 17 is connected to the 1A input terminal of a monostable circuit 19 (type SN 74123) with external components providing a reversion time of 100 nS. The 1$\overline{Q}$ output terminal of this monostable circuit 19 is connected to the LOAD terminal of the counter 16. This counter 16 too has its preset data input terminals connected to a matrix which determines the count loaded into the counter 16. This in turn determines the number of degrees through which the engine shaft turns during the average signal generating operation. The BORROW terminal of the counter 16 is connected to the A1 input terminal of an SN 74121 integrated monostable circuit 20 with external components (not shown) giving a reversion time of 100 ns.

The output terminal of the V.C.O. 11 is connected to the 1C input terminal of a gate circuit 21 constituted by an SN 74120 pulse synchroniser integrated circuit. The $\overline{Q}$ output terminal of the monostable circuit 15 is connected to the 1S1 input terminal of this gating circuit and the 1$\overline{Y}$ output terminal thereof is connected to the COUNT DOWN terminal of a presettable counter 22 (an SN 74190 counter 1C) having its BORROW output terminal connected to its LOAD input terminal so that it acts as a programmable frequency divider. The data input terminals of the counter 22 are connected to the same matrix as that to which the data input terminals of the counter 16 are connected. Thus, for every n pulses from the gating circuit there is a single pulse from the BORROW output terminal of the counter 22, where n is the number loaded into the counter 16.

The BORROW output terminal of the counter 22 is connected to the CLOCK terminal of a signal counter 23 type SN 74161 which has its CLEAR terminal connected to the 1$\overline{Q}$ output terminal of the monostable circuit 19. The A,B,C and D output terminals of the counter 23 are respectively connected to the 4D, 3D, 2D and 1D input terminals of a latch circuit 24 type SN 74100, which has its ENABLE terminal connected to the Q output terminal of the monostable circuit 20, through a buffer stage.

Except for the V.C.O. 11 all the integrated circuits included in the example described are Texas Instruments TTL circuits. It is to be understood that any of the counters 16, 17, 22 and 23 may consist of two or more of the integrated circuits described connected in cascade to provide more bits, in which case the resolution of the system may be improved to 1° or better instead of 20°.

The operation of the circuit described is straightforward. For the duration of each 25 μS pulse from the monostable circuit 15 the gating circuit 21 passes forward pulses produced by the V.C.O. 11. The counter 22 divides the frequency of these pulses by the set number and its output pulses are accumulated by the counter 23.

A cycle of operation may be regarded as starting with a 180° pulse at the terminal 12. This pulse initiates loading of counter 17 to its pre-set state and this counter then counts down to zero, being clocked by the 25 μS pulses being generated at 20° engine shaft intervals. When the pre-set count has been counted out the output pulse from the monostable circuit 19 clears counter 23 and loads counter 16 with its pre-set count state (n) and this count then counts down n 25 μS 20° pulses. During this count down period the counter 23 accumulates a count equal to the average number of pulses produced by the V.C.O. 11 in the n 25 μS periods during which the gating circuit 21 has been passing pulses and at the end of the period the latch 24 is enabled and then holds the average count until enabled again at the end of the next cycle.

Since the 180° marker pulses at terminal 12 coincide with appropriate ones of the 20° marker pulses at the terminal 13, the correct choice of the reversion times of the various monostable circuits is important. The 600 nS time for monostable circuit 14 ensures that when counter 16 is loaded a positive edge is available after loading is complete so that the first 20° pulse can be counted. The 25 μS time for monostable circuit 15 ensures that the BORROW output pulses from the various counters appear only when the V.C.O. 11 is not being sampled. The 100 nS time for the remaining monostable circuits 18, 19 and 20 ensures that the correct positive edge is counted down by the counters loaded by the pulses, and also ensures that the clearing and latching of counter 23 and latch 24 both occur when no sampling of the V.C.O. is taking place.

The 180° marker pulses referred to above occur at that interval only in the case of a 4-cylinder engine. For 6 or 8 cylinder engines the interval is 120° or 90° respectively.

Counters 16 and 17 have been found to produce spurious pulses when being loaded. These could interfere with the circuit operation. To eliminate these effects, the output terminal of monostable circuit 18 is connected to CLEAR terminal of monostable circuit 19 and the output terminal of monostable circuit 19 is connected to the CLEAR terminal of monostable circuit 20.

I claim:

1. A circuit for producing a digital count representing the average value of the frequency of a variable frequency signal pulse train comprising means for generating fixed duration pulses, a control counter for counting a predetermined number of said fixed duration pulses, gate means for passing said variable frequency signal only during said fixed duration pulses, frequency dividing means producing one output pulse each time said gate means passes said predetermined number of signal pulses and signal counter means counting the number of said output pulses produced during the time taken for said control counter to count said predetermined number of said fixed duration pulses.

2. A circuit as claimed in claim 1 further comprising a source of marker pulses of frequency less than that of the fixed duration pulses, a delay counter connected to said source and to said generator and arranged to count pulses from said generator commencing with receipt thereby of a marker pulse, said delay counter being connected to said control counter and to said signal counter and acting to delay commencement of counting by said control counter and said signal counter following a marker pulse until a preset number of fixed duration pulses have been received by the delay counter.

3. A circuit for producing a digital count representing the average value of the frequency of a variable frequency signal pulse train, comprising a control pulse source, a first monostable circuit connected to said control pulse source for producing output pulses of fixed duration synchronised with said control pulses, a control counter connected to the first monostable to count pulses therefrom, said control counter having a plurality of preset data input terminals, a load terminal, a signal applied to which causes preset data to be loaded into the counter, and an output terminal at which a signal is produced when the count state of the counter is at a fixed level, gate means connected to said first monostable circuit and to the source of said variable frequency pulse train and providing a pulsed output at the frequency of said pulse train only during the fixed duration pulses, a frequency divided counter connected to the gate means and having preset data terminals, such that the dividing counter is set to its preset count state each time it produces an output, a common preset data matrix connected to apply identical preset data inputs to the control counter and the frequency divider, a signal counter connected to the output of the dividing counter and counting the total number of output pulses from the dividing counter in the time taken for the preset number of fixed duration pulses to be counted by the control counter, means for periodically resetting the control counter and the signal counter and means controlled by the control counter for periodically extracting the count from the signal counter.

4. A circuit as claimed in claim 3 in which said means for periodically resetting the control counter and the signal counter comprises a marker pulse source, a delay counter presettable by pulses from said marker pulse source and connected to said monostable circuit to count the fixed length pulses therefrom, the output of the delay counter being connected to the load terminal of the control counter and to a clear terminal of the signal counter.

5. Apparatus as claimed in claim 3 in which the control pulse source is an engine shaft position transducer producing said control pulses at predetermined angular intervals as the engine shaft rotates.

6. Apparatus as claimed in claim 5 in which the source of the variable frequency pulse train is a voltage controlled operator controlled by an engine parameter.

7. A circuit as claimed in claim 6 in which the engine parameter is an air pressure.

* * * * *